United States Patent [19]
Sato et al.

[11] Patent Number: 5,545,050
[45] Date of Patent: Aug. 13, 1996

[54] IC SOCKET

[75] Inventors: Kazumasa Sato; Akihiko Kokubu, both of Yokohama, Japan

[73] Assignee: Wells Japan Limited, Kanagawa-ken, Japan

[21] Appl. No.: 319,731

[22] Filed: Oct. 7, 1994

[30] Foreign Application Priority Data

Jun. 7, 1994 [JP] Japan ................... 6-125004

[51] Int. Cl.⁶ .................................... H01R 13/62
[52] U.S. Cl. .............................. 439/331; 439/73
[58] Field of Search .................. 439/259, 261–268, 439/330, 331, 73, 72, 525, 526

[56] References Cited

U.S. PATENT DOCUMENTS

| | | | |
|---|---|---|---|
| 4,750,891 | 6/1988 | Egawa | 439/259 |
| 4,758,176 | 7/1988 | Abe et al. | 439/331 |
| 5,167,515 | 12/1992 | Matsuoka et al. | 439/342 |
| 5,213,531 | 3/1993 | Matsuoka et al. | 439/331 |
| 5,399,108 | 3/1995 | Lu et al. | 439/682 |

*Primary Examiner*—Hien D. Vu
*Attorney, Agent, or Firm*—Nikaido Marmelstein Murray & Oram LLP

[57] ABSTRACT

Disclosed is an IC socket for use in testing IC packages, comprising a socket body having a plurality of Y-shaped contact pieces so arranged as to permit them to contact the lead conductors of an IC packages to be tested and a lid which is spring-biased so as to rise up, and is responsive to application of a push for closing and covering the top of the socket body while pushing the lead conductors of the IC package against the contact pieces. the V-shaped head of the contact piece body has the effect of increasing the flexibility with which it accommodates a selected lead conductor, thus assuring that good contact can be made between the lead conductor, thus assuring that good contacts can be made between the lead conductors of the IC package and the contact pieces of the IC socket even after the IC socket is used many times.

7 Claims, 7 Drawing Sheets

FIG. 1
FIG. 2
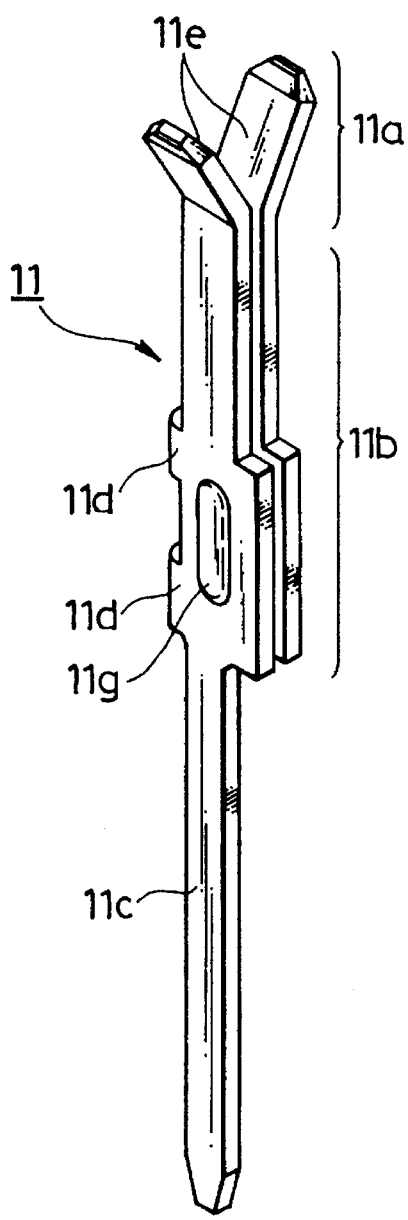
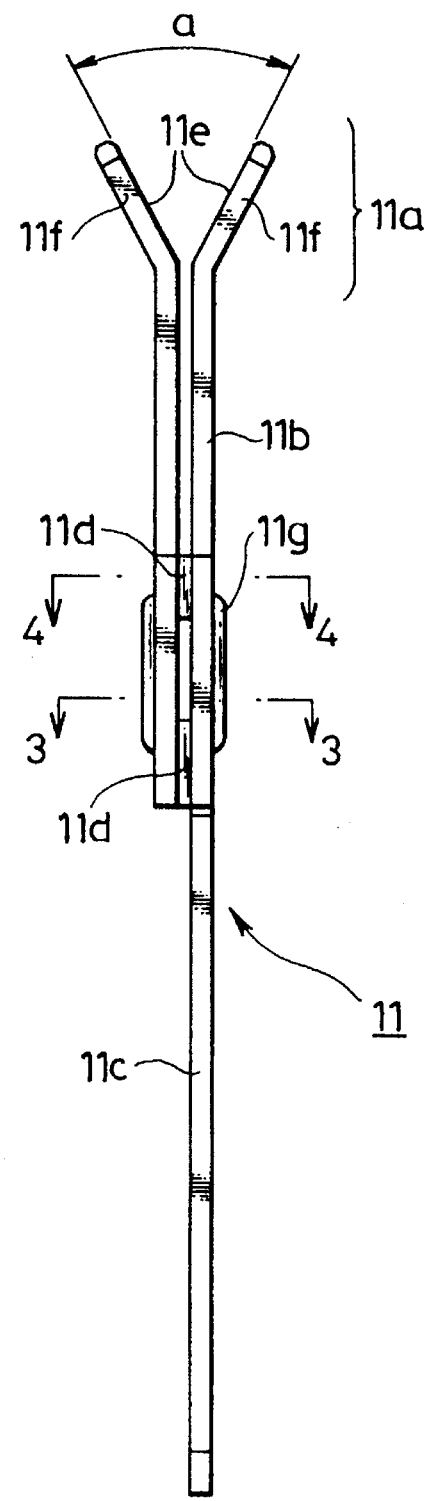

IC SOCKET

BACKGROUND OF THE INVENTION

1. Field of the Invention

The present invention relates to an electrical IC socket to accommodate and IC package so as to permit access to its lead conductors from the outside for testing the IC package.

2. Description of Related Art

A conventional IC socket for use in testing IC packages is shown in FIGS. 12 and 13. It comprises a body 4 having a plurality of throughout holes 2 made at regular intervals therein and the corresponding plurality of resilient contact pieces 3 inserted in these through holes, a top or lid 6 hinged to the body 4 so as to cover the open top of the body 4 and being capable of lifting up, and lock means 7 to hold the lid 6 in the closed position, thereby the lid pushes the lead conductors 8a of an IC package 8 against the head portions 3a of the contact pieces 3. A plurality of IC sockets 1 (for example, 100 to 200 IC sockets) are fixed to a printed circuit board for the purpose of testing. An IC package 8 to be tested is laid on the body 4 of each IC socket 1, putting the body's hemispherical shaped lead conductors 8a in contact with the head portions 3a of the contact pieces 3 of the IC socket 1.

An automatic closing device equipped with pressing means is used to push and close lid 6 until the open top of the body 4 of every IC socket is covered, thereby causing the lead conductors 8a of the IC package 8 to be pushed against the head portions 3a of the contact pieces 3. Thus, all IC packages are ready for testing.

The printed circuit board bearing the closed IC sockets is put in a high-temperature vessel, in which the IC packages are subjected to a computer-aided test for a predetermined time at an increased temperature. IC packages which are found defective are discarded.

As seen from FIG. 12, the lid 6 has a latch 7 rotatably fixed to the lid's edge. The latch 7 is inwardly spring-biased. A riser 4a projects from the front side of the socket body 4. When it is an IC socket 1 is to be loaded with an IC package 8, first, the IC socket is unlocked to open the lid 6 based on the action of the spring 5a, and an IC package 8 is put inside. Then, the lid 6 is pushed horizontally by the pressing means of the automatic closing device so that the nail 7b of the latch 7 rides over the riser 4a to be caught thereby. Thus, the lid 6 is locked in a closed position.

In this closed position the pushing plate 6a of the lid 6 is applied to the underlying IC package 8 via the pushing plate 6a so that the hemispherical shaped lead conductors 8a of the IC package 8 are pressed against the head portions 3a of the contact pieces 3 of the IC socket 1.

There is, however, the problem of there being a lack of sufficient reliability in making good contacts between the lead conductors 8a and the head portions 3a of the contact pieces 3; some lead conductors may be somewhat deformed by pressing against corresponding contact pieces, and such deformed lead conductors cannot be exactly aligned with other normal lead conductors in a level manner. The irregular levels of such deformed lead conductors of the IC package will cause incomplete electric contacts with the counter contact pieces of the IC socket.

When making contacts between the lead conductors 8a of the IC package 8 and the head portions 3a of the contact pieces 3, the stem portions 3c of the contact pieces 3 are bent to produce counter resilient forces, thereby positively raising the head portions 3a of the contact pieces 3 to contact the lead conductors 8a of the IC package 8. The space occupied by the stem portion 3c of the contact piece 3 is relatively large both in longitudinal and lateral dimensions. Accordingly, the whole size of the IC socket 1 increases, and accordingly the number of IC sockets fixed to a printed circuit board decreases.

When the head portions 3a of the contact pieces 3 are raised by counter resilient forces produced in the stem portions 3c of the contact pieces 3, it is possible that the head portions 3a of some contact pieces 3 may be caught by the side walls of selected through holes 2, thus failing to contact corresponding lead conductors 8a of the IC package 8.

SUMMARY OF THE INVENTION

The object of the present invention is to provide an IC socket which is free of such defects as described above, that is preventing appreciable deformation of lead conductor tips to assure reliable contact between each and every lead conductor of an IC package and head portion of the corresponding contact piece of the IC socket.

To attain this object an IC socket comprising: a body having a plurality of through holes made at regular intervals therein and the corresponding plurality of contact pieces inserted in the through holes; a top or lid to cover the open top of the body and the lid being capable of lifting up; and lock means to hold the lid in a closed position, thereby the lid pushes the lead conductors of an IC package against the heads of the contact pieces for testing the IC package, wherein each contact piece has a V-shaped head.

The V-shaped head of the contact piece has two divergent inclined extensions to snugly accommodate the end of the lead conductor, thus functioning as contact. The lead conductors of the IC package are in a form of hemispherical solder bumps.

The contact piece comprises a first body half of a leg, a trunk half and an inclined head half and a second body half of a trunk half and an inclined head half. This form a Y-shaped contact piece. These first and second body halves are laid on each other, and connected by at least one joint with their inclined head halves diverging upward. The joint connects the first and second body halves at a level lower than the midpoint of each body half. The first and second body halves are substantially adjacent and parallel to each other.

The through holes are arranged in rows (or lateral lines) and columns (or longitudinal lines) in the socket body, and these rows and columns cross over each other to make up a lattice. Each contact piece has a respective head inclined at each crossing in the lattice.

The V-shaped head of the contact piece is effective in dividing the downward pushing force of the hemispherical end of the lead conductor into two components directed along the inclined extensions of the bifurcated branches, thus causing the downward pushing force to be partly distributed in horizontal directions.

Reduction of the height of contact pieces has the effect of suppressing the antenna effect at the time of testing, accordingly improving high-speed transmission characteristics.

Also, advantageously the slopes of the bifurcated branches cause a wiping effect every time the lead conductor is made to contact the Y-shaped head of the contact piece, thus keeping the contact surface clean all the time.

The divergent head shape extending from the trunk of the contact piece has the effect of increasing the flexibility with which the head of the contact piece receives the lead conductor, and at the same time, of increasing the resiliency with which the head returns to its original shape, thus eliminating the possibility of causing poor contact between the lead conductor and the contact piece.

The contact pieces are arranged in the same fashion as the lead conductors of the IC package to be tested, as for instance in lattice or in staggered fashion.

Also, as seen from FIG. 9, holes can be made in every other crossing in each longitudinal an lateral line in the IC socket, thereby reducing the interval at which Y-shaped contact pieces are arranged, thus meeting the demand of increasing the number of contact pieces per unit area in the IC socket.

Other object and advantages of the present invention will be understood from the following description of IC sockets according to preferred embodiments of the present invention, which are shown in accompanying drawings.

BRIEF DESCRIPTION OF THE DRAWINGS

FIG. 1 is a perspective view of a contact piece to be used in an IC socket according to the present invention FIG. 2 is a front view of the contact piece;

DESCRIPTION OF THE PREFERRED EMBODIMENTS

Figure 3:
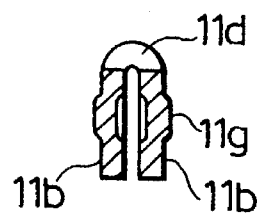
FIG. 3 is a cross section of the contact piece taken along the line A—A in FIG. 2.
Figure 4:
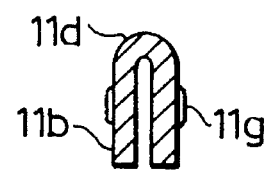
FIG. 4 is a cross section of the contact piece taken along the line B—B in FIG. 2.

Referring to drawings, contact pieces 11 are made of phosphor bronze, beryllium bronze or stainless steel, and their heads 11A are formed in the shape of the letter "V".

As seen from FIGS. 1 to 4, the V-shaped head 11a of the contact piece 11 has two divergent inclined extensions 11f to snugly accommodate the end of the lead conductor. The divergent angle "a" is about 57°±5°, and the divergent slopes 11e provide the surfaces on which the lead conductor 8a contacts.

The contact pieces 11 comprises a first body half of a leg 11c, a trunk half 11b, and an inclined head half, Extension 11f and a second body half of a trunk half 11b and an inclined head half, extension 11f. These first and second body halves are laid on each other, and are connected by two joints 11d, which are integrally connected to the trunk halves 11b. Specifically, these first and second body halves are drawn on a metal sheet and are arranged side by side, and connected by two joints 11d. Thus, the one-legged human shape thus drawn is stamped from the metal sheet as a whole, and it is folded one side on the other, thus laying the trunk halves on each other with the inclined head halves diverging upward. Each of the two joints 11d are so narrow in width as to facilitate the folding of one side on the other into a human shape. A single joint can be used although it must be relatively wide.

These joints connect the first and second body halves at a level lower than the midpoint of each trunk half, accordingly increasing the length from the head 11a to the joints lid, and hence reducing the bending rigidity of each of the head halves, extensions 11f, in opposite opening directions. Thus, the flexibility of each extension 11f increases substantially, and accordingly the yield strength against repeated loading increases.

Each trunk half has a rib 11g for reinforcement. Also, it is effective in increasing the resistance of the contact piece against the potential slipping-off from the associated hole in the socket body.

When a lead conductor 8a is applied to the V-shaped head 11a, the divergent head halves 11e will open wide, thus snugly accommodating the lead conductor 8a. This flexible arrangement permits omission of the bendable length 3c of the conventional contact piece (FIG. 12), which otherwise, would be required for resilient contacting. Accordingly the height of the contact piece can be reduced, compared with the conventional contact piece.

Figure 5:
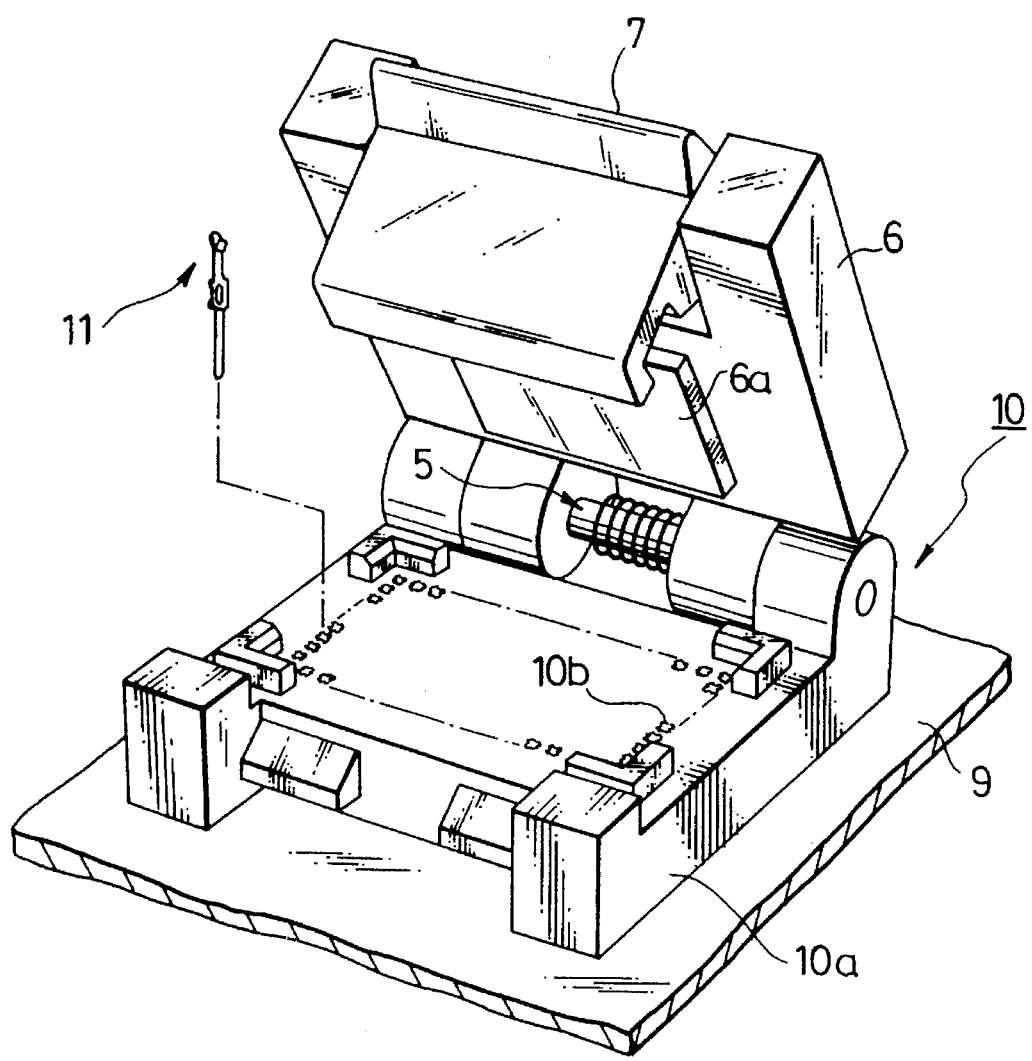
FIG. 5 is a perspective view of an IC socket according to the present invention.

Contact pieces 11 are inserted in the through holes 10b, which are arranged in the form of lattice as shown in FIG. 5.

Figure 6:
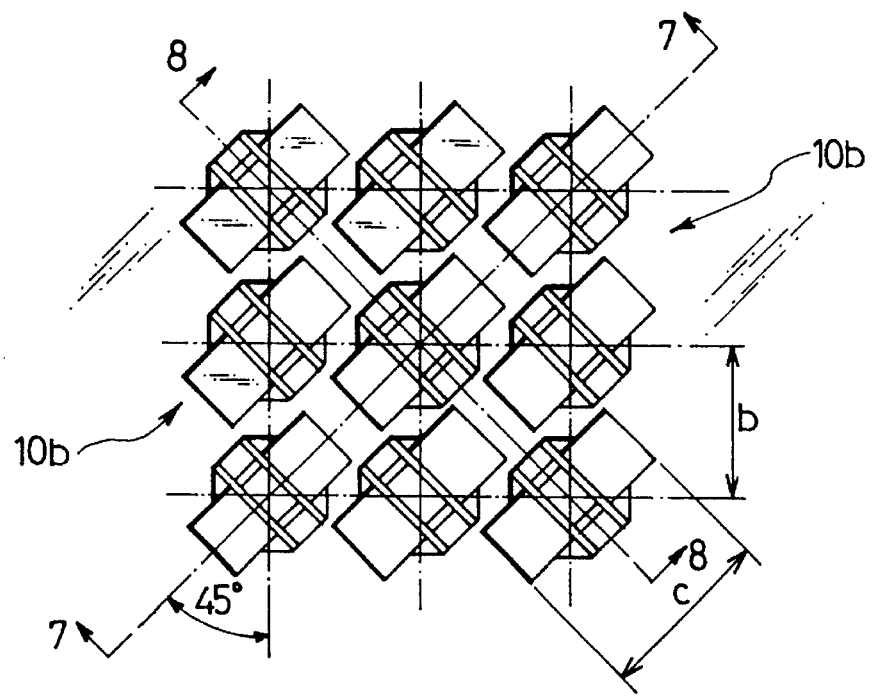
FIG. 6 shows an arrangement of holes made in the IC socket.
Figure 7:
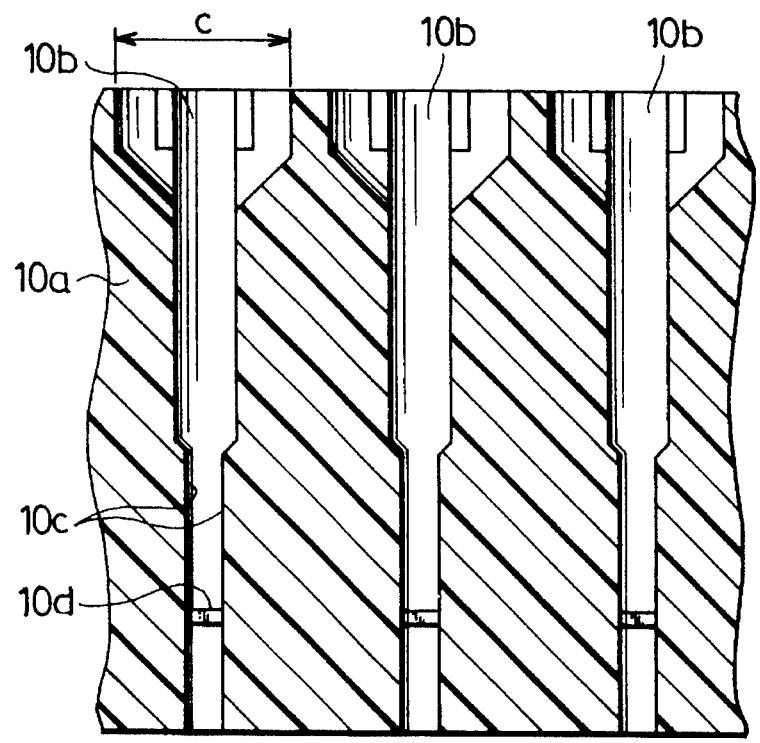
FIG. 7 is a longitudinal section of the IC socket taken along the line F—F in FIG. 6.
Figure 8:
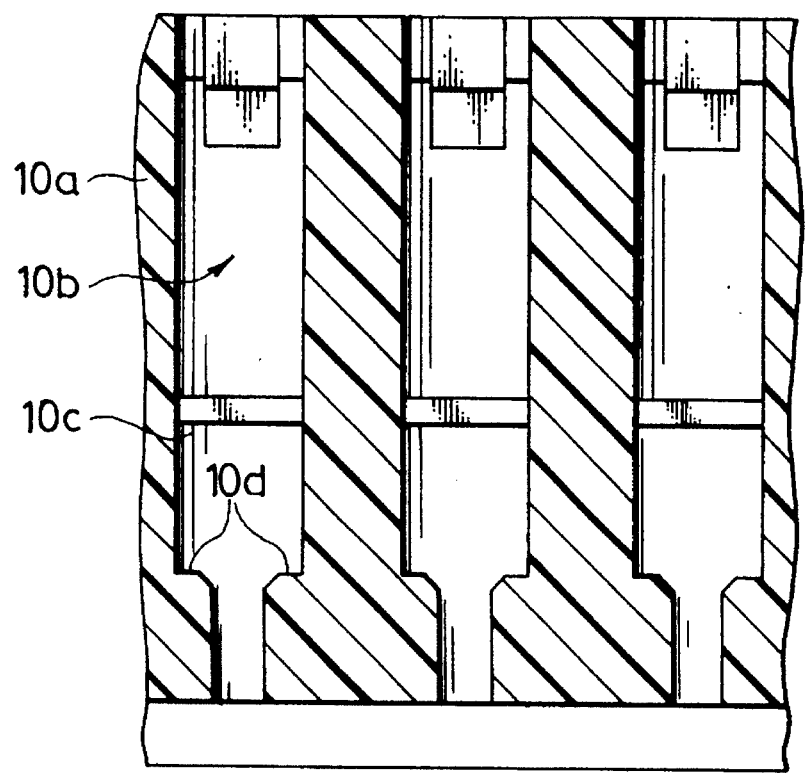
FIG. 8 is a longitudinal section of the IC socket take along the line G—G in FIG. 6.

Referring to FIGS. 6 to 8, holes 10b are arranged at regular intervals b at the crossings of the lattice and these holes are inclined 45 degrees relative to the longitudinal and lateral lines.

The top of the hole 10b in which the V-shaped head of the contact piece is fitted, is longer than the interval b between adjacent longitudinal or lateral lines, but no interference is caused between adjacent elongated tops because of the oblique arrangement of the holes. Therefore, holes can be made at an increased density.

As described earlier, the ribs 11g of the opposite trunk halves are pushed against the inner wall 10c of the hole 10b, thereby generating a counter force to hold the contact piece 11 firmly inside.

The lower end of the trunk half 11b of the first body half of the contact piece 11 is caught by a lateral projection 10d on the inner wall 10c of the hole 10b.

Figure 9:
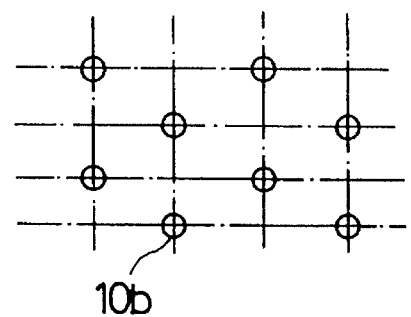
FIG. 9 shows another arrangement of holes made in the IC socket.

In general, the through holes 10b are arranged in rows and columns in the socket body, thus forming a lattice in shape. As seen from FIG. 9, however, the through holes 10b may be arranged at every other crossing in the lattice in the staggered fashion. As a matter of course, through holes may be arranged in the same fashion as the lead conductors 8a in an IC package 8 to be tested.

The manner in which an IC socket 10 according to the present inventions is used in testing an IC package 8, such as a BGA package having a plurality of solder bumps as lead conductors, is described as follows.

A required number of IC sockets 10 are fixed to a printed circuit board 9, and an automatic loading device is used in putting IC packages 8 inside with their lead conductors 8a aligned with the holes 10b each of the IC socket bodies 10a.

An automatic closing device is used in pushing simultaneously the lids 6 of all IC sockets 10 in a horizontal direction. As seen from FIG. 10, the lid 6 of every IC socket is rotated to close the socket body 10a, and then, the lead conductors or solder bumps 8a are pushed against the V-shaped heads of the contact pieces 11.

Specifically the lead conductor 8a is pushed against the divergent slopes 11e of the head halves while the opposite upper lengths from the joints 11d of the contact piece 11 are opened wide, thus preventing deformation of the lead conductor 8a.

Then, the inclined surfaces of the head halves are wiped with the descending lead conductor, thus keeping the contact surfaces clean all the time.

Figure 10:
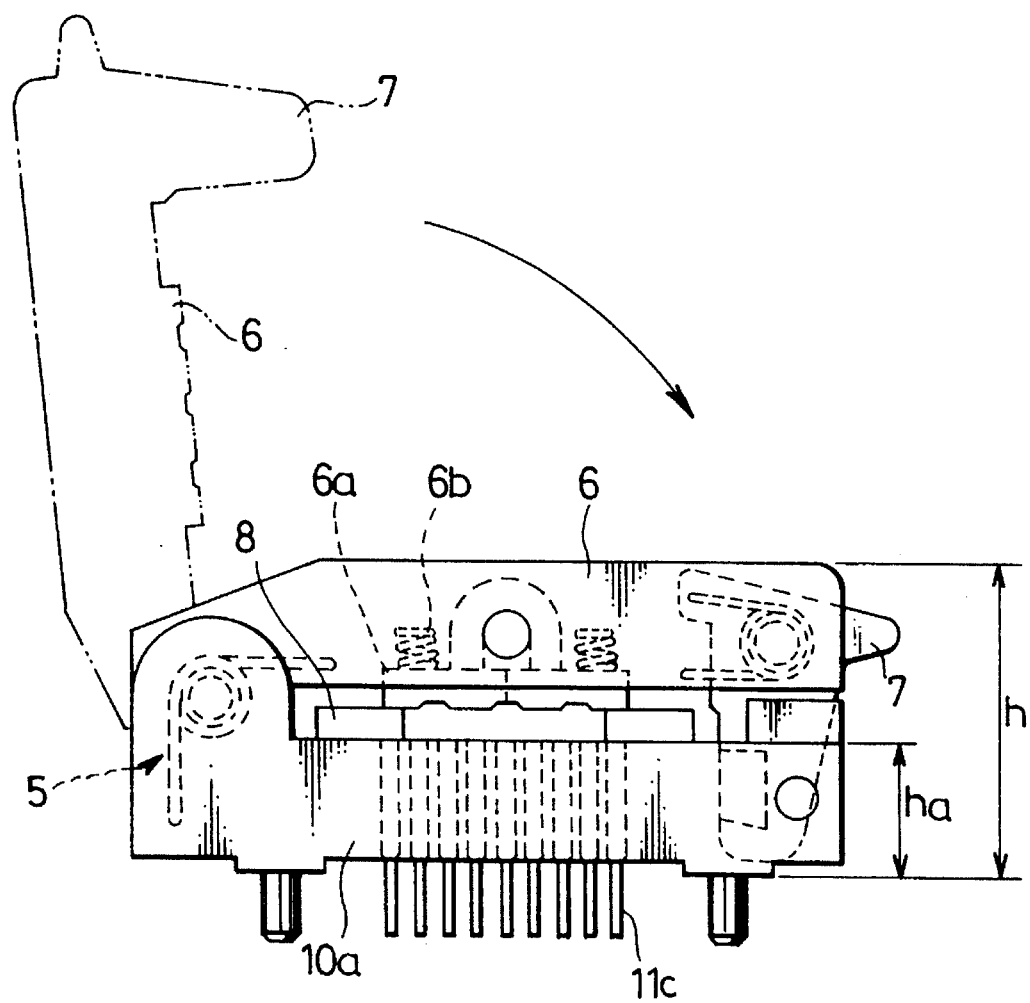
FIG. 10 shows the manner in which the IC socket is used, showing its inner structure in phantom lines.
Figure 11:
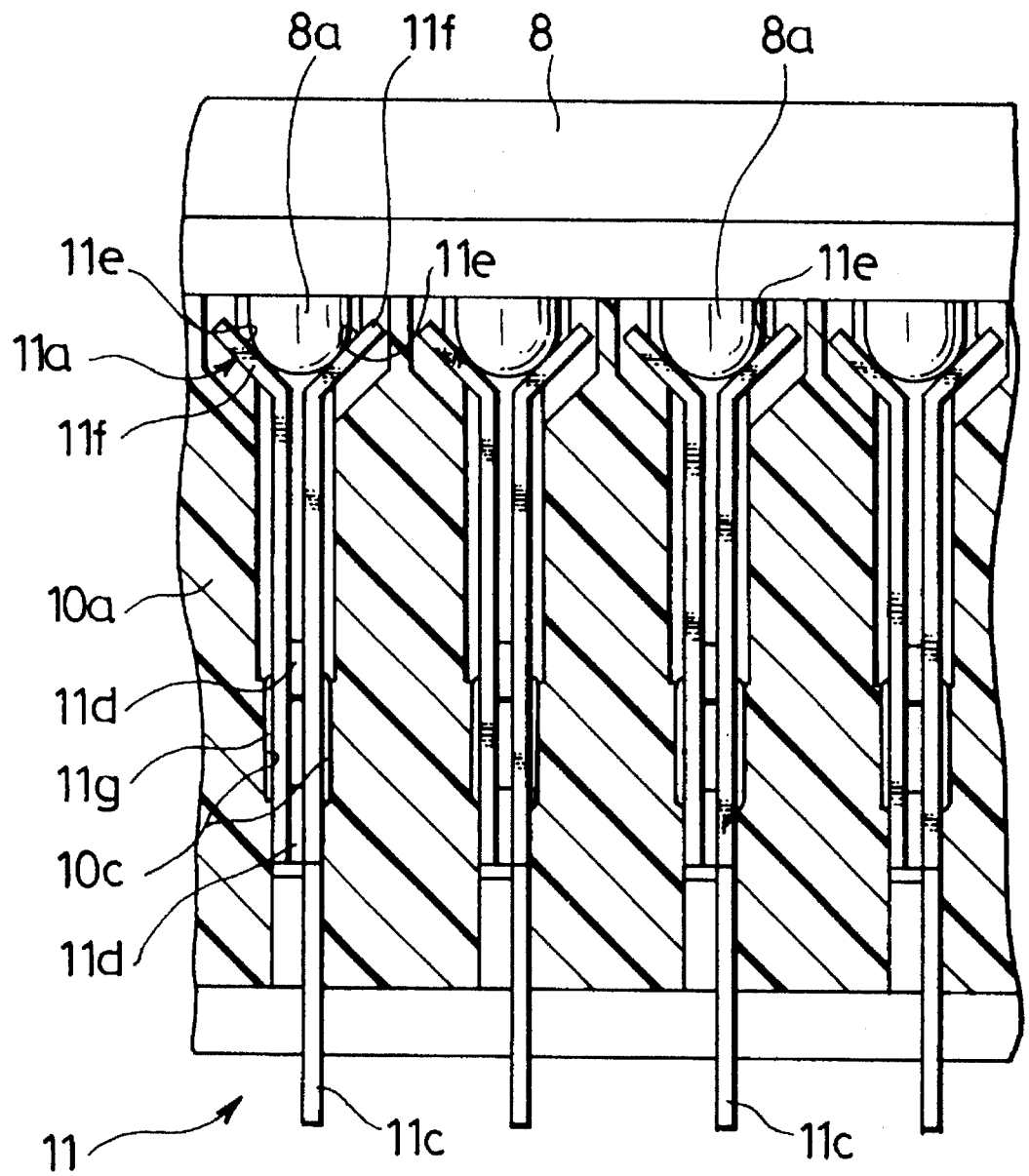
FIG. 11 is a longitudinal section of a part of IC socket, showing the manner in which lead contacts contact the V-shaped heads of the counter contact pieces.
Figure 12:
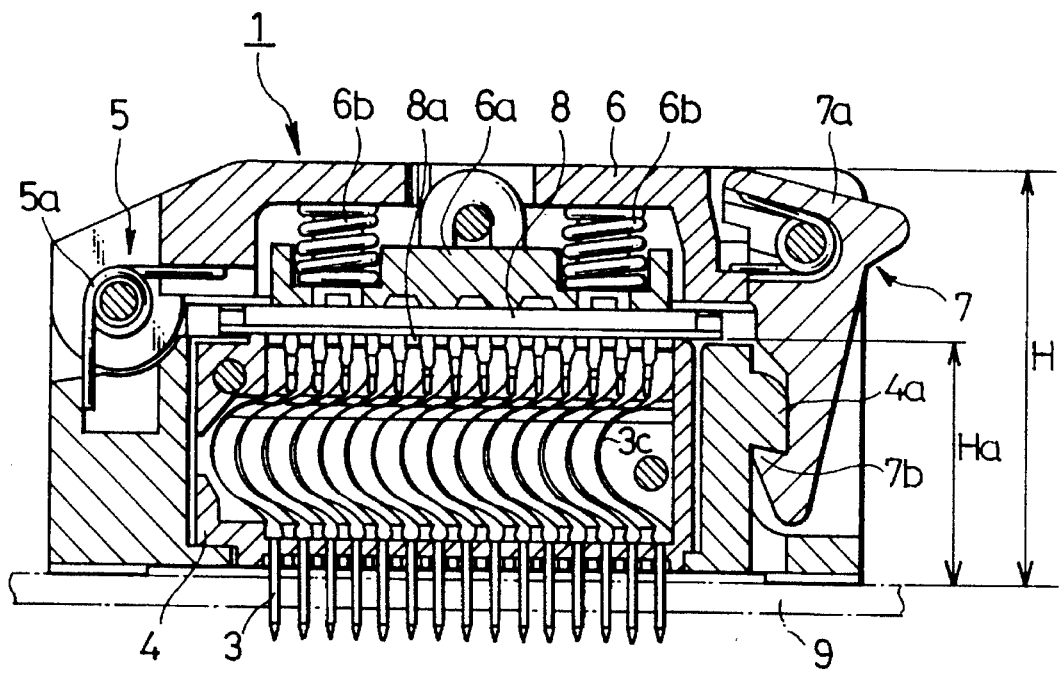
FIG. 12 is a longitudinal section of a conventional IC socket, showing the manner in which it is used.
Figure 13:
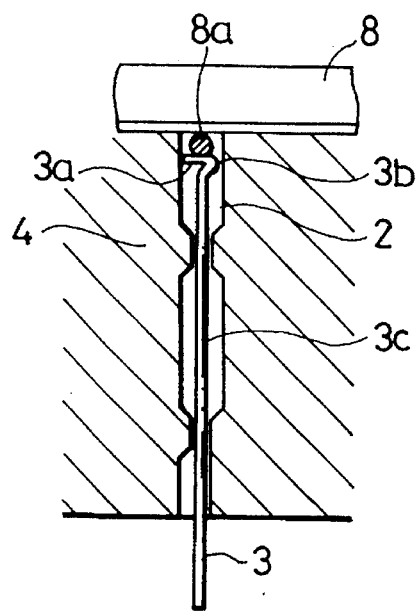
FIG. 13 shows, partly in section, the manner in which a lead contact is put in contact with the counter contact piece in the conventional IC socket.

Comparison of the IC socket of FIG. 10 with the conventional IC socket of FIG. 12 reveals that the former socket has a height shorter than the latter socket. For example, the height h is about 16 mm, and the height h a is about 5.9 mm in FIG. 10 whereas the height H is about 22.2 mm, and the height H a is about 13 mm in FIG. 12. Thus, the whole height of the IC socket is reduced by 30%, and the height up to the IC bearing level is reduced by about 60%.

Reduction of the height up to the IC bearing level causes reduction of current carrying path, which is advantageous both to the requirement for permitting ICs 8 to maintain their high-speed characteristics, and to suppression of antenna effects, and hence noises caused thereby in testing.

All contact pieces 11 are put at the crossings of a lattice with each V-shaped head 11a inclined relative to the longitudinal and lateral lines at each crossing. Accordingly the intervals b at which the contact pieces are arranged, can be reduced, and accordingly the number of contact pieces can be increased. The space which is occupied by all contact pieces is substantially smaller than that which is occupied by the same number of contact pieces in the conventional arrangement, and accordingly the socket size can be reduced.

A printed circuit board 9 can have more IC sockets 10 than conventional IC sockets 1, and therefore the number of IC sockets for a testing lot can be increased, accordingly improving the working efficiency.

In testing a plurality of printed circuit boards each bearing IC sockets are put in a high-temperature vessel, in which all ICs are supplied with electric current, for instance at 150° C. for 8 hours, thus subjecting all ICs to expedited deterioration to positively cause initial fault in selected ICs, and at the same time, subjecting all ICs to performance tests.

After testing the printed circuit boards 9 are removed from the high-temperature vessel, and then all IC sockets are unlatched by applying a push to their lids 6, thus allowing the lids 6 to lift up under the influence of spring 5a, opening the IC sockets 10.

The automatic loading device is used to selectively collect IC packages, discarding those found defective among them. The testing and selecting of ICs is repeated.

IC sockets 10 having Y-shaped contact pieces 11 according to the present invention have an increased durability and reliability, not requiring the changing of contact pieces of an elongated period, and accordingly reducing the required maintenance. The changing of contact pieces can be easily effected simply by pulling up and removing old ones and by inserting new ones in the holes of the IC socket. In use the lead conductors 8a of an IC package sweep the surfaces of the head halves of the contact pieces to remove dusts therefrom every time an IC package is put in the IC socket, thus keeping the surfaces of the head halves of the contact pieces clean all the time. This wiping effect contributes to the making of good electrical connections between the lead conductors 8a and the contact pieces.

What is claimed is:

1. An electrical IC socket comprising:

a body having a plurality of through holes, each hole made at a regular interval and a corresponding plurality of contact pieces inserted in said through holes wherein each of the contact pieces comprises a first body half with a leg, a first trunk half and a first inclined head half and a second body half with a second trunk half and a second inclined head half, wherein said first and second trunk halves are disposed substantially adjacent and parallel to each other and said first and second trunk halves are integrally connected by at least one joint and wherein the first and second inclined head halves diverge upwardly;

a lid to cover an open top of said body and said lid being capable of lifting up;

and lock means on said lid to hold said lid in a closed position with said body, thereby the lid pushes lead conductors of an IC package against heads of said contact pieces for testing the IC package.

2. An electrical IC socket according to claim 1, wherein said first inclined head half and said second inclined head half of the contact piece form a V-shape to snugly accommodate an end of one of said lead conductors.

3. An electrical IC socket according to claim 2, wherein the lead conductors of the IC package are in a form of hemispherical solder bumps.

4. An electrical IC socket according to claim 1, wherein the at least one joint connects said first and second body halves at a level lower than a midpoint of each trunk half.

5. An electrical IC socket according to claim 1, wherein said through holes are arranged in rows and columns in the body.

6. An electrical IC socket according to claim 5, wherein said rows and columns cross over each other to make up a lattice.

7. An electrical IC socket according to claim 5, wherein each head of each of said contact pieces is inclined at each crossing in said lattice.

* * * * *